United States Patent
Sforzin et al.

(10) Patent No.: US 12,046,322 B2
(45) Date of Patent: Jul. 23, 2024

(54) CONFIGURABLE DATA PROTECTION CIRCUITRY FOR MEMORY DEVICES

(71) Applicant: Micron Technology, Inc., Boise, ID (US)

(72) Inventors: Marco Sforzin, Cernusco sul Naviglio (IT); Paolo Amato, Treviglio (IT)

(73) Assignee: Micron Technology, Inc., Boise, ID (US)

( * ) Notice: Subject to any disclaimer, the term of this patent is extended or adjusted under 35 U.S.C. 154(b) by 147 days.

(21) Appl. No.: 17/895,053

(22) Filed: Aug. 24, 2022

(65) Prior Publication Data
US 2024/0071448 A1    Feb. 29, 2024

Related U.S. Application Data

(60) Provisional application No. 63/239,010, filed on Aug. 31, 2021.

(51) Int. Cl.
*G11C 7/10* (2006.01)
*G11C 7/24* (2006.01)

(52) U.S. Cl.
CPC .............. *G11C 7/24* (2013.01); *G11C 7/1012* (2013.01); *G11C 7/1063* (2013.01); *G11C 7/109* (2013.01)

(58) Field of Classification Search
CPC ....... G11C 7/24; G11C 7/1012; G11C 7/1063; G11C 7/109
See application file for complete search history.

(56) References Cited

U.S. PATENT DOCUMENTS

| | | | |
|---|---|---|---|
| 6,370,668 B1 * | 4/2002 | Garrett, Jr. .......... | G06F 11/1044 714/763 |
| 7,096,407 B2 | 8/2006 | Olarig | |
| 2004/0081005 A1 * | 4/2004 | Garrett, Jr. .......... | G06F 13/1684 365/200 |
| 2004/0163027 A1 | 8/2004 | MacLaren et al. | |
| 2019/0138390 A1 | 5/2019 | Fisher et al. | |
| 2021/0194508 A1 | 6/2021 | Kim et al. | |

* cited by examiner

*Primary Examiner* — Jay W. Radke
(74) *Attorney, Agent, or Firm* — Brooks, Cameron & Huebsch, PLLC

(57) ABSTRACT

Systems, apparatus, and methods related to configurable data protection circuitry. A memory includes a plurality of memory devices and a memory controller that can be coupled to the memory via a plurality of channels. The channels comprise respective subsets of the plurality of memory devices. The memory controller comprises data protection circuitry to accommodate a first codeword configuration of a number of codewords responsive to the plurality of memory devices having a first operating mode corresponding to a first input/output (I/O) width and accommodate a second codeword configuration of the number of codewords responsive to the plurality of memory devices having a second operating mode corresponding to a second I/O width, as well as switch between the first operating mode of the plurality of memory devices and the second operating mode of the plurality of memory devices.

20 Claims, 10 Drawing Sheets

CONFIGURABLE DATA PROTECTION CIRCUITRY FOR MEMORY DEVICES

PRIORITY INFORMATION

This application claims the benefit of U.S. Provisional Application No. 63/239,010, filed Aug. 31, 2021, the contents of which are incorporated herein by reference.

TECHNICAL FIELD

The present disclosure relates generally to semiconductor memory and methods, and more particularly, to apparatuses, systems, and methods for configurable data protection circuitry for memory devices.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, ferroelectric random access memory (FeRAM), and resistance variable memory such as phase change random access memory (PCRAM), resistive random access memory (RRAM), and magnetoresistive random access memory (MRAM), such as spin torque transfer random access memory (STT RAM), among others.

Memory controllers can communicate with memory devices through a plurality of channels. Each channel can have a particular width that corresponds to a quantity of input/output links (e.g., DQ pins). Therefore, the quantity of memory devices per channel can depend on the channel width and on the mode (e.g., type) of the memory devices. For example, some memory devices may be x8 memory devices having 8 data (e.g., DQ) pins, while other memory devices may be x16 memory devices having 16 data pins.

Various data protection schemes can be used to ensure the integrity of data written to and read from the memory devices. For example, some data protection schemes, which may be referred to as "chip kill" schemes spread user data and parity data as codewords across multiple channels in a manner that allows for recovery of user data in the event that a particular channel fails (i.e., a particular memory die or chip corresponding to the channel fails).

DETAILED DESCRIPTION

Figure 1:
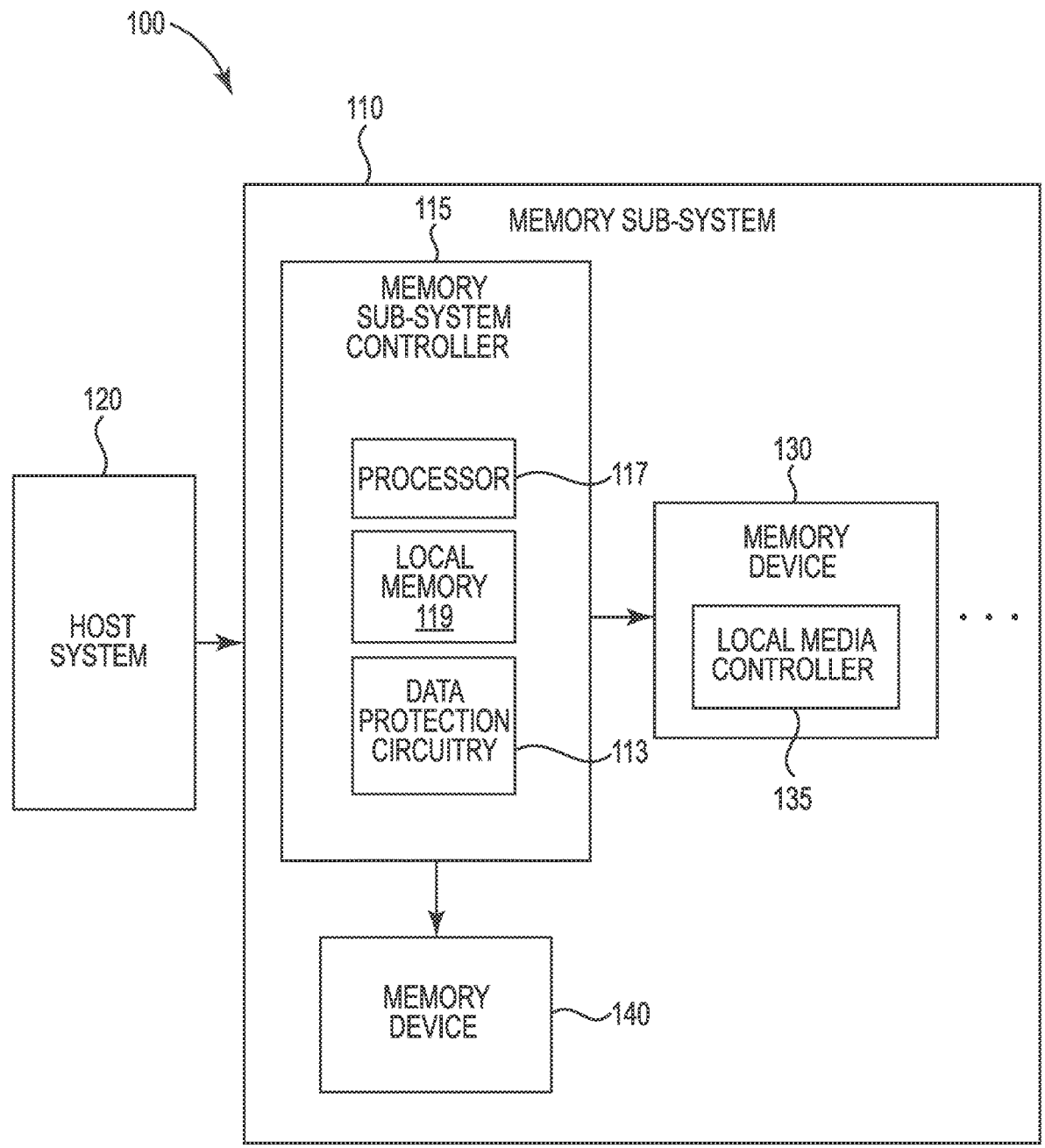
FIG. 1 illustrates an example computing system that includes a memory sub-system in accordance with a number of embodiments of the present disclosure

Systems, apparatuses, and methods related 10 to configurable data protection circuitry for semiconductor devices are described. A controller includes configurable data protection circuitry to correct data sent between a memory controller and a plurality of memory devices. The configurable data protection circuitry can be configured to configure codewords based on the mode of the memory devices that are sending and/or receiving the data. For example, the same configurable data protection circuitry can be implemented in a memory controller configure to manage memory devices with x8 mode components and memory devices with x16 mode components.

Systems, apparatuses, and methods related to configurable data protection circuitry for semiconductor devices are described. The configuration of the configurable data protection circuitry can change based on the mode of the memory devices coupled to the controller in which the configurable data protection circuitry is implemented. In some embodiments, the mode of each memory device can be either a x16 operating mode or a x8 operating mode. As used herein, the term "x16 operating mode" refers to using sixteen (16) input/output (I/O) lines (e.g., DQs) to transfer data between a memory device and a memory controller. If a channel has a width of 16 bits, for example, 16 bits of data can be transferred through the channel at one time to or from a single memory device. As used herein, the terms "x8 operating mode" refer to using eight (8) I/O lines to transfer data between a memory device and a controller. If the data is being transferred through a channel with a width of 16 bits, two different memory devices of a particular channel can transfer data through the channel simultaneously. For instance, each of two x8 mode memory devices can transfer 8 bits of data through the 16-bit channel. In various embodiments, multiplexors can be implemented into the configurable data protection circuitry to change the configuration of the configurable data protection circuitry depending on the operating mode of the memory devices (e.g., depending on whether the memory devices are x8 mode devices or x16 mode devices). In this manner, the composition of the codewords can be configured to adapt the data protection circuitry to different memory device modes.

As memory systems are tasked with performing more complicated operations, multiple types of memory devices may be implemented in a memory system to store different types of data. In some approaches, configurable data protection circuitry can be used to configure data received from a plurality of memory devices. However, various prior approaches lack the flexibility to function with different types of memory devices.

In contrast, embodiments described herein are directed to configurable data protection circuitry that can be configured in different modes based on the mode of the memory devices coupled to the controller in which the configurable data protection circuitry is implemented. The memory devices can include multiple types of memory devices, such as memory devices that include x4 components, x8 components, and/or x16 components. The different types of components indicate the quantity of data I/Os (e.g., DQ pins), which corresponds to the quantity of data bits that can be transferred to/from the memory device (e.g., in a single beat, which may refer to data transmitted as part of a particular clock cycle). For example, a x4 memory device can include 4 DQ pins, a x8 memory device can include 8 DQ pins, and a x16 memory device can include 16 DQ pins. By implementing the configurable data protection circuitry into a controller to configure data received from multiple types of memory devices with differing types of components, less space in a memory system can be dedicated to configuring data received from memory devices. Less space can be dedicated to configuring the data because a single controller with configurable data protection circuitry can be used to configure the data received from multiple memory devices instead of using a different controller with different data protection circuitry for each type of memory device. By dedicating less space within a memory system to configuring data received from memory devices, more space within the memory system becomes available to implement components that perform different functions. Further, because some embodiments of the present disclosure are directed to a single memory controller to perform the operations described herein (as opposed to the multiple controller architectures of some approaches), issues that can arise from inadequate thermal dissipation that can be prevalent in multiple controller approaches can be mitigated.

In some embodiments, the memory system can be a Compute Express Link (CXL) compliant memory system (e.g., the memory system can include a PCIe/CXL interface). CXL is a high-speed central processing unit (CPU)-to-device and CPU-to-memory interconnect designed to accelerate next-generation data center performance. CXL technology maintains memory coherency between the CPU memory space and memory on attached devices, which allows resource sharing for higher performance, reduced software stack complexity, and lower overall system cost.

CXL is designed to be an industry open standard interface for high-speed communications, as accelerators are increasingly used to complement CPUs in support of emerging applications such as artificial intelligence and machine learning. CXL technology is built on the peripheral component interconnect express (PCIe) infrastructure, leveraging PCIe physical and electrical interfaces to provide advanced protocol in areas such as input/output (I/O) protocol, memory protocol (e.g., initially allowing a host to share memory with an accelerator), and coherency interface.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

It is also to be understood that the terminology used herein is for the purpose of describing particular embodiments only, and is not intended to be limiting. As used herein, the singular forms "a," "an," and "the" can include both singular and plural referents, unless the context clearly dictates otherwise. In addition, "a number of," "at least one," and "one or more" (e.g., a number of memory banks) can refer to one or more memory banks, whereas a "plurality of" is intended to refer to more than one of such things.

Furthermore, the words "can" and "may" are used throughout this application in a permissive sense (i.e., having the potential to, being able to), not in a mandatory sense (i.e., must). The term "include," and derivations thereof, means "including, but not limited to." The terms "coupled" and "coupling" mean to be directly or indirectly connected physically or for access to and movement (transmission) of commands and/or data, as appropriate to the context. The terms "data" and "data values" are used interchangeably herein and can have the same meaning, as appropriate to the context.

FIG. 1 illustrates an example computing system 100 that includes a memory sub-system 110 in accordance with a number of embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein, the term "coupled to" or "coupled with" can refer to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 can write and/or read data from the memory sub-system 110.

The host system 120 can be coupled to the memory sub-system 110 via an interface (e.g., a physical host interface). Examples of an interface can include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), Universal Serial Bus (USB), or any other interface. The interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The interface can provide a way for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory components such as 3D cross-point array of non-volatile memory cells and NAND type memory (e.g., 2D NAND, 3D NAND) are described, the memory device 130 can be based on various other types of non-volatile memory or storage device, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can, include one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface (not pictured) circuitry to communicate with the host system 120 via a physical host interface (not pictured). The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes configurable data protection circuitry 113. In some embodiments, the configurable data protection circuitry 113 is located on a memory sub-system controller 115. In some embodiments, the configurable data protection circuitry 113 is not part of the memory sub-system controller 115. The configurable data protection circuitry 113 can be used to configure data received from a memory device 130, 140. In some embodiments, the memory sub-system 110 includes configurable data protection circuitry 113 that can configure data received from a memory device 130, 140. In some embodiments, the memory sub-system controller 115 includes at least a portion of the configurable data protection circuitry 113. For example, the memory sub-system controller 115 can include a processor 117 (processing device) configured to execute instructions stored in local memory 119 for performing the operations described herein.

The configurable data protection circuitry 113 can configure data received from a memory device 130, 140. The configurable data protection circuitry 113 can configure data received from different types of memory featuring components in different modes. For example, the same configurable data protection circuitry 113 can be used to configure data received from memory devices that include, at least, x4 components, x8 components, and x16 components. Characteristics of data can change based on the type of components used in the memory device 130, 140. The configurable data protection circuitry 113 can include circuitry to correct data received from each of the different types of memory components.

The configurable data protection circuitry 113 can include multiplexors to switch between configurations of the configurable data protection circuitry 113. The multiplexors can change the configuration of the configurable data protection circuitry 113 to match the components of the memory device 130, 140 coupled to the controller 115 in which the configurable data protection circuitry is implemented.

Figure 2:
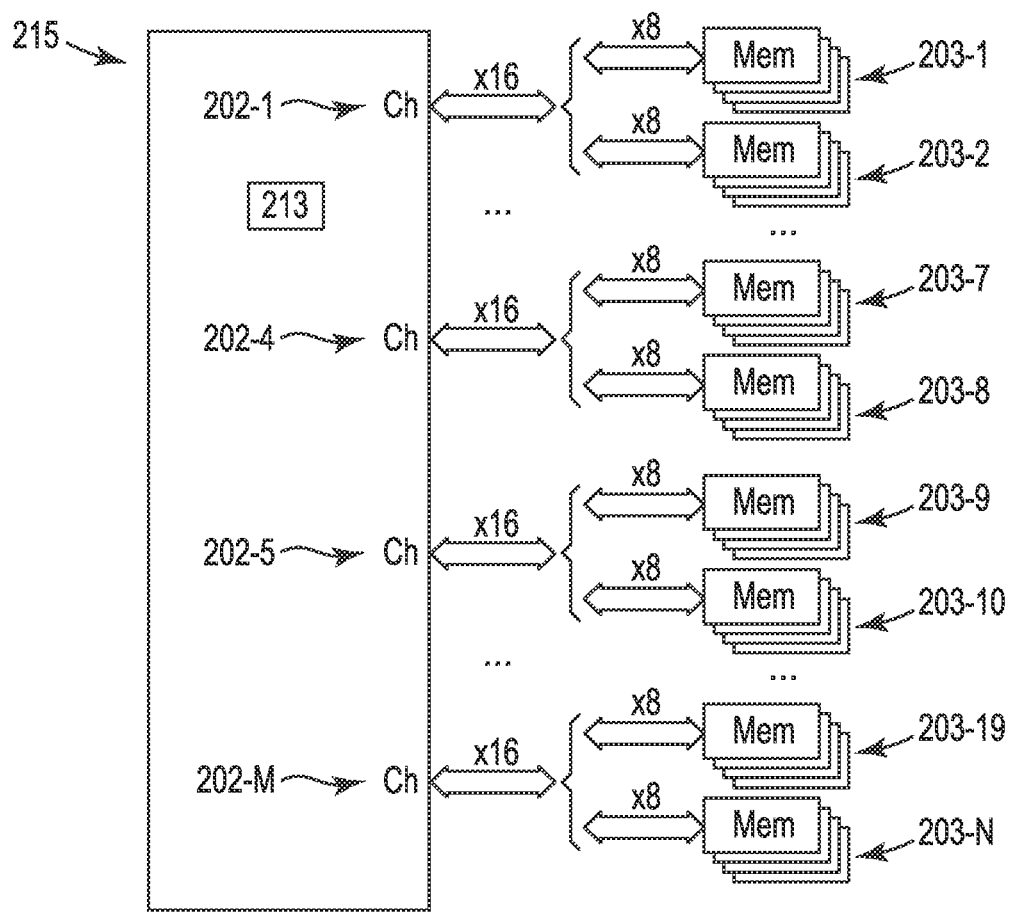
FIG. 2 illustrates a portion of a memory sub-system in accordance with a number of embodiments of the present disclosure.

FIG. 2 illustrates a portion of a memory sub-system in accordance with a number of embodiments of the present disclosure. In this example, the memory subsystem (e.g., memory subsystem 110 shown in FIG. 1) includes a plurality of memory devices 203-1, 203-2, . . . , 203-N (referred to generally as memory devices 203) coupled to a memory sub-system controller 215 via a plurality of channels 202-1, 202-2, . . . , 202-M. As an example, the memory sub-system shown in FIG. 2 can be a DRAM module such as a DIMM.

The capacity of a memory sub-system (e.g., module) can depend on various factors. For instance, for a fixed quantity of channels, the module capacity can depend on the capacity per memory device, the type of memory devices (e.g., whether the memory devices are x8 memory devices or x16 memory devices), and the quantity of ranks. For example, if each channel has a width of 16 bits, then utilizing x8 mode memory devices will double the capacity as compared to utilizing x16 mode memory devices. Also, increasing the quantity of ranks increases the storage capacity of the memory module. A rank refers to a group of memory devices that are accessed (e.g., by the controller 215) simultaneously. The number of memory devices in a rank can be determined by the operating mode of the memory devices in each rank. For example, each rank can include two x8 memory devices per channel or one x16 memory device per channel.

In the example shown in FIG. 2, each channel 202 has a width of 16 bits; however, embodiments are not limited to a particular channel width. For example, each of the plurality of channels can have a width of N bits, wherein N is an integer that is greater than one. In this example, the memory devices 203 are x8 mode memory devices comprising 8 data (e.g., DQ) pins. In this example, the memory devices 203 are quad-die package (QDPs) each comprising four memory dice that can be grouped as a plurality of ranks. Each rank can comprise one die from each of the memory devices 203-1 to 203-N. For instance, the example shown in FIG. 2 includes four ranks with each rank comprising one x8 memory die from each of the memory devices 203-1 to 203-N.

In various embodiments, the memory devices 203 can be x16 mode devices. For example, each of the memory devices 203-1 to 203-N can be a QDP comprising 16 DQ pins (instead of 8 DQ pins). The x16 mode memory devices can be grouped as four ranks and would provide half the capacity as the x8 mode example shown in FIG. 2. That is, since the channel width is 16 bits, two x8 mode memory devices per channel provide 8 bits each to controller 215 per beat as compared to a single x16 mode memory device per channel providing 16 bits to controller 215 per beat. In some embodiments, the plurality of channels 202 can be low-power double data rate 5 (LPDDR5) channels 202.

Figure 3A:
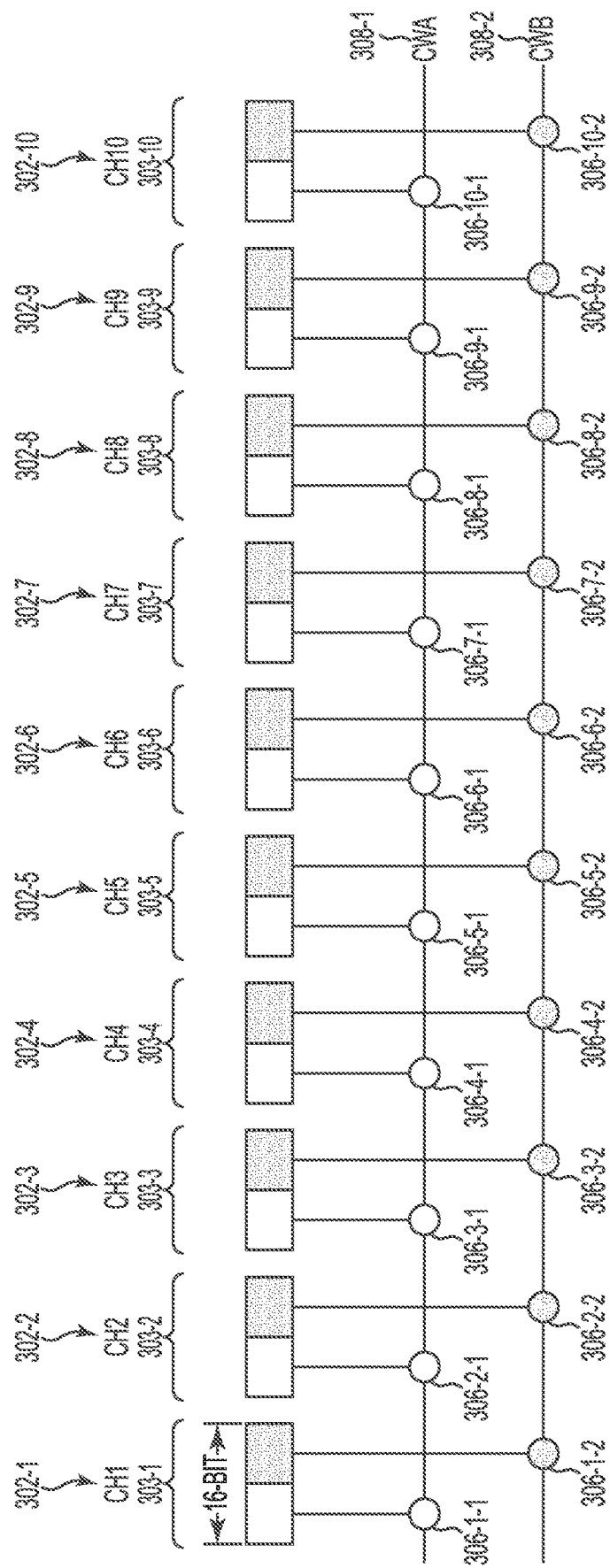
FIG. 3A illustrates example codeword compositions corresponding to a data protection scheme that spans multiple channels comprising memory devices having a particular operating mode.

FIG. 3A illustrates example codeword compositions corresponding to a data protection scheme that spans multiple channels comprising memory devices having a particular operating mode. The example shown in FIG. 3A illustrates two codewords 308-1 (CWA) and 308-2 (CWB) generated by a plurality of memory devices 303-1 to 303-10 (referred to collectively as memory devices 303) corresponding to respective channels 302-1 (CH1) to 302-10 (CH10) (referred to collectively as channels 302). In this example, the channels 302 have a width of 16 bits and the memory devices 303 are x16 mode memory devices such that the memory devices 303 each provide 16 bits across the respective channels 302 per beat. As noted above, the memory devices 303 can be, for example, a package comprising multiple components (e.g., dice) grouped as a number of ranks. In this example, the data protection scheme is a "chip kill" scheme in which each codeword (e.g., 308-1 and 308-2) comprises eight data symbols and two parity symbols (which may be referred to as an "8+2" scheme). The data protection scheme allows for the data of codewords 308-1 and 308-2 to be recovered if one of the channels 302 fails. For example, if the memory device 303-1 is determined to be defective, the data of codewords 308-1 and 308-2 can be recovered using the data symbols from the other (e.g., non-defective) channels 302 and the parity symbols.

As shown in FIG. 3A, codeword 308-1 comprises symbols 306-1-1, 306-2-1, 306-3-1, 306-4-1, 306-5-1, 306-6-1, 306-7-1, 306-8-1, 306-9-1, and 306-10-1, and codeword 308-2 comprises symbols 306-1-2, 306-2-2, 306-3-2, 306-

4-2, 306-5-2, 306-6-2, 306-7-2, 306-8-2, 306-9-2, and 306-10-2. The symbols can be collectively referred to as symbols 306. In this example each of the symbols 306 comprise 8 bits such that each x16 mode device 303 provides 8 bits to codeword 308-1 and 8 bits to codeword 308-2 per beat; however, embodiments are not so limited. Also, in this example, the symbols 306-9-1 and 306-10-1 are the parity symbols for codeword 308-1 and the symbols 306-9-2 and 306-10-2 are the parity symbols for codeword 308-2. However, embodiments are not limited to parity symbols being provided from particular channels. The operating mode of the data protection circuitry can determine which channels provide the data symbols and which channels provide the parity symbols.

In various embodiments, the codewords 308-1 and 308-2 are decoded by decoder circuitry and encoded by encoder circuitry, which may be included within data protection circuitry such as data protection circuitry 113 and 213 described in association with FIGS. 1 and 2, respectively. Each of the codewords 308-1 and 308-2 can be provided to the same encoder/decoder.

Figure 3B:
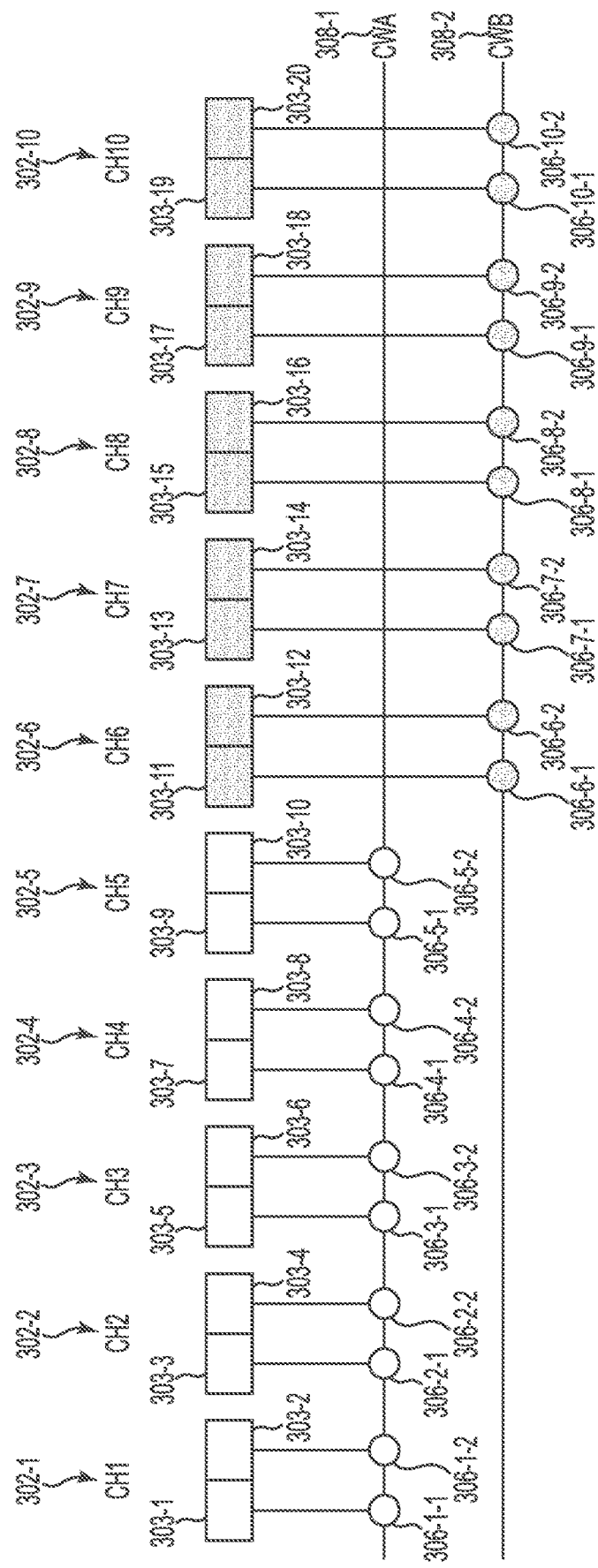
FIG. 3B illustrates example codeword compositions corresponding to a data protection scheme that spans multiple channels comprising memory devices having a particular operating mode.

FIG. 3B illustrates example codeword compositions corresponding to a data protection scheme that spans multiple channels comprising memory devices having a particular operating mode. Similar to the example shown in FIG. 3A, the example shown in FIG. 3B illustrates two codewords 308-1 (CWA) and 308-2 (CWB) generated by memory devices 303 across multiple channels 302-1 (CH1) to 302-10 (CH10), with each channel 302 having a width of 16 bits. However, in the example shown in FIG. 3B, the memory devices 303-1 to 303-20 are x8 mode memory devices such that two memory devices 303 per channel 302 contribute 8 bits each to generate codewords 308-1 and 308-2. In this example, the data protection scheme is an "8+2" chip kill scheme in which each codeword (e.g., 308-1 and 308-2) comprises eight data symbols and two parity symbols. Data from a first memory device (e.g., 303-1, 303-3, 303-5, 303-7, 303-9, 303-11, 303-13, 303-15, 303-17, and 303-19) and data from a second memory device (e.g., 303-2, 303-4, 303-6, 303-8, 303-10, 303-12, 303-14, 303-16, 303-18, and 303-20) can be accessed separately when the data protection circuitry is configured in the x8 mode.

As shown in FIG. 3B, codeword 308-1 comprises symbols 306-1-1, 306-1-2, 306-2-1, 306-2-2, 306-3-1, 306-3-2, 306-4-1, 306-4-2, 306-5-1, and 306-5-2, and codeword 308-2 comprises symbols 306-6-1, 306-6-2, 306-7-1, 306-7-2, 306-8-1, 306-8-2, 306-9-1, 306-9-2, 306-10-1, and 306-10-2. Similar to the example in FIG. 3A, each of the symbols 306 comprise 8 bits; however, in this example, the codewords 308-1 and 308-2 are configured differently. For instance, in the example shown in FIG. 3B, the symbols 306-5-1 and 306-5-2 from channel 302-5 are the parity symbols corresponding to codeword 308-1 and the symbols 306-10-1 and 306-10-2 are the parity symbols for codeword 308-2. Also, in this example, each x8 mode device 303 provides all of its 8 bits to a same codeword per beat, whereas in the example shown in FIG. 3B each x16 mode device provides 8 bits to each of two different codewords 308-1 and 308-2 per beat.

In various embodiments, the codewords 308-1 and 308-2 are decoded by decoder circuitry and encoded by encoder circuitry, which may be included within data protection circuitry such as data protection circuitry 113 and 213 described in association with FIGS. 1 and 2, respectively. Each of the codewords 308-1 and 308-2 can be provided to the same encoder/decoder.

Various previous data protection approaches may include encoder/decoder circuitry (e.g., engines) adapted for a particular type of memory device. For example, the encoder/decoder circuitry may be adapted for a data protection scheme (e.g., chip kill scheme) configured for operation with either x8 mode components or x16 mode components. As described further below, one benefit of embodiments of the present disclosure is the ability to accommodate chip kill data protection schemes independent of the memory device type. For example, various embodiments provide data protection circuitry (e.g., of a controller) that can be configured to operate with multiple different memory device types (e.g., x4 devices, x8 devices, x16 devices, etc.). For instance, the same circuitry (e.g., hardware) can be used to accommodate a data protection scheme involving a module comprising x8 mode memory components or a module comprising x16 mode memory components. As described in connection with FIGS. 4 and 6, the data I/Os (DQs) from the memory devices to the decoder circuitry and the encoder outputs to the data I/Os can be routed differently depending on the operating mode of the memory devices, which can allow a particular controller to implement a chip kill data protection scheme independent of the memory device operating mode. Embodiments can reuse data protection circuitry for memory devices having different operating modes, which can reduce the area of a controller on which the circuitry is implemented, among various other benefits.

Figure 3C:
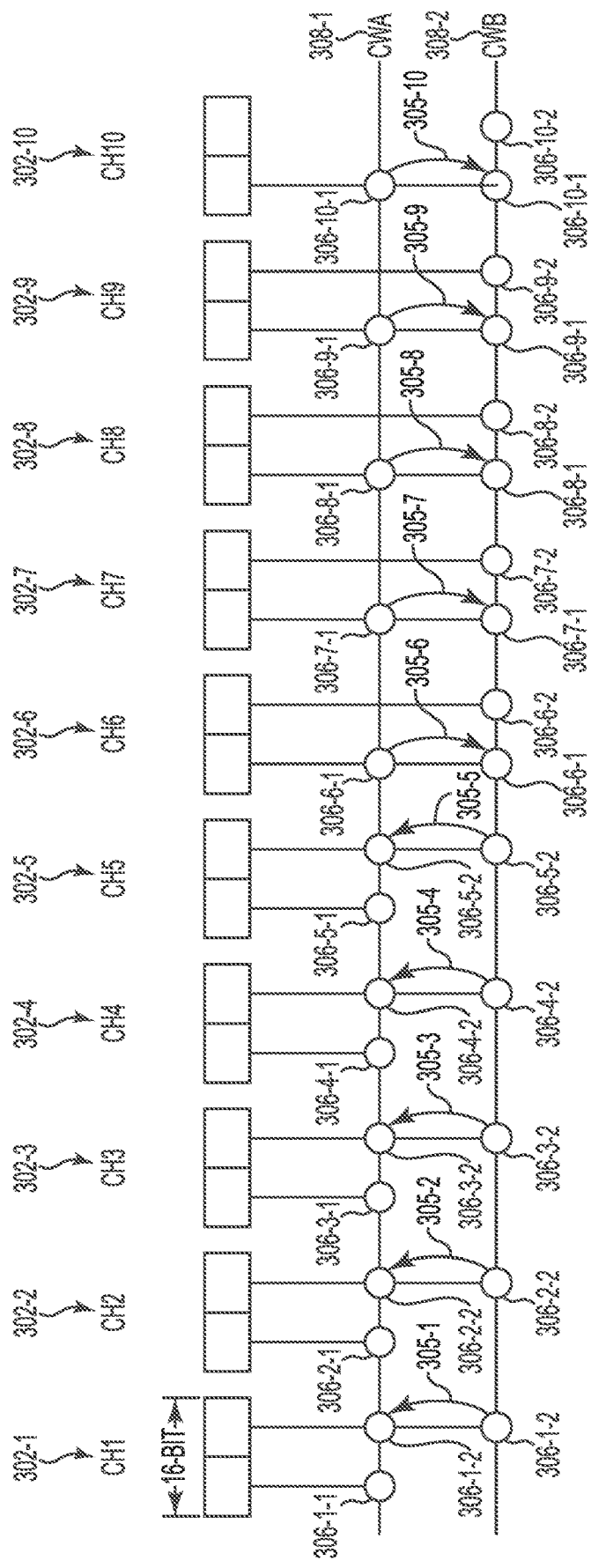
FIG. 3C illustrates an example of how the composition of codewords corresponding to a data protection scheme can be configurable based on the operating mode of memory devices in accordance with a number of embodiments of the present disclosure.

FIG. 3C illustrates an example of how the composition of codewords corresponding to a data protection scheme can be configurable based on the operating mode of memory devices in accordance with a number of embodiments of the present disclosure. FIG. 3C illustrates an example of how codewords 308-1 and 308-2 can be configured differently in order to implement a data protection scheme (e.g., chip kill scheme) using the same data protection circuitry (e.g., encoder/decoder hardware) for memory devices having different operating modes. FIG. 3C represents a combination of the chip kill schemes described in FIGS. 3A and 3B.

In the example shown in FIG. 3C the configuration of the codewords 308-1 and 308-2 is based on the operating mode of the memory devices 303. The different codeword configurations are defined by arrows 305-1, 305-2, 305-3, 305-4, 305-5, 305-6, 305-7, 305-8, 305-9, and 305-10 (referred to collectively as arrows 305). That is, a first codeword configuration, such as that shown in FIG. 3A is represented by the tails (e.g., backs) of the arrows 305, and a second codeword configuration, such as that shown in FIG. 3B, is represented by the heads (e.g., fronts) of the arrows 305. For example, if the memory devices are x16 mode devices such as shown in FIG. 3A, then the data protection circuitry can be configured to encode/decode codewords 308-1/308-2 as shown in FIG. 3A, and if the memory devices are x8 mode devices such as shown in FIG. 3B, then the data protection circuitry can be configured to encode/decode codewords 308-1/308-2 as shown in FIG. 3B. For example, as described in FIG. 4, the same encoder/decoder circuitry can be used to accommodate different codeword configurations by routing the DQs of the memory devices differently depending on the operating modes of the memory devices.

Figure 4:
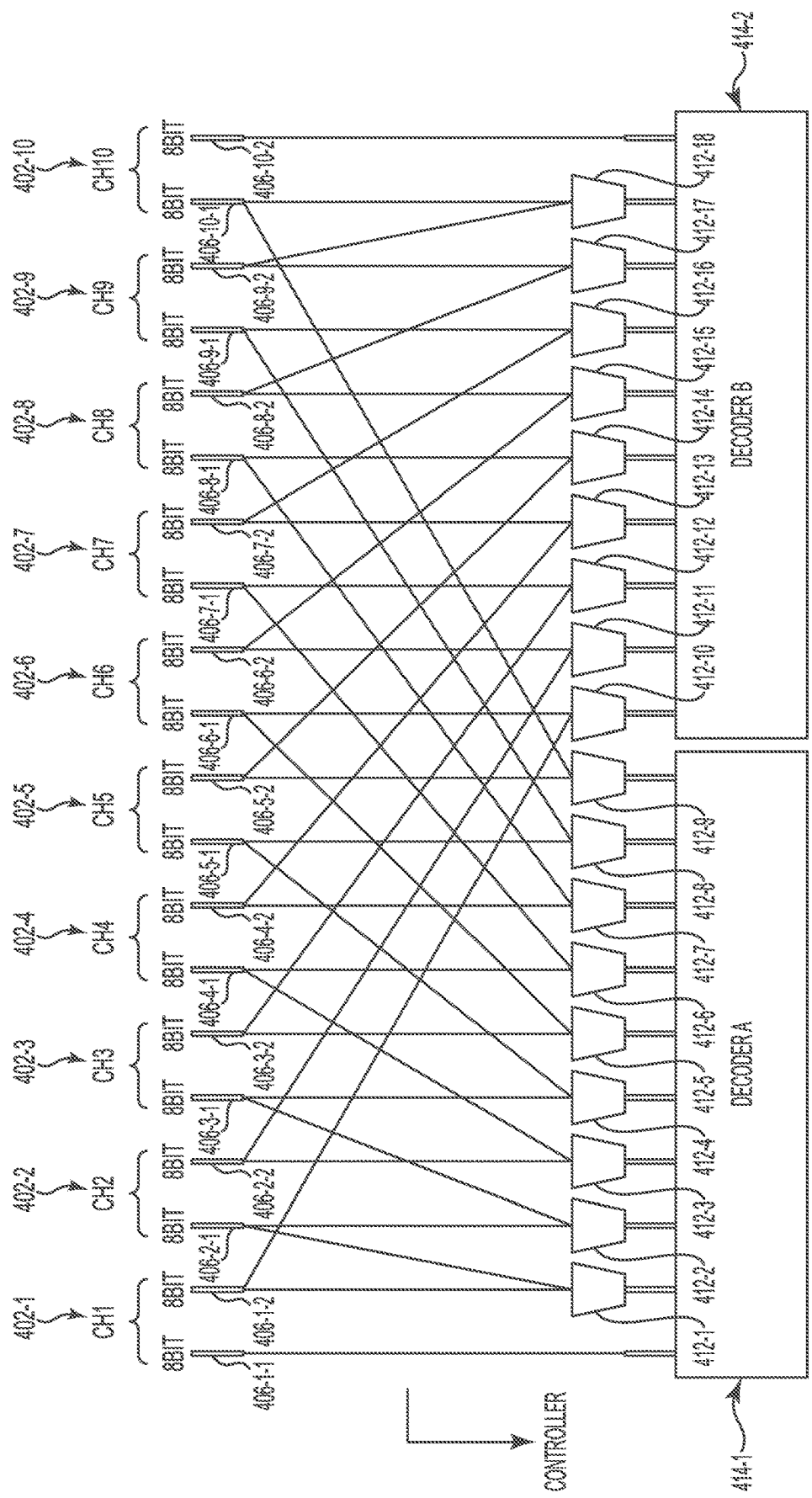
FIG. 4 illustrates a functional block diagram of example configurable data protection circuitry in accordance with a number of embodiments of the present disclosure.

FIG. 4 illustrates a functional block diagram of example configurable data protection circuitry in accordance with a number of embodiments of the present disclosure. In a number of embodiments, and as shown in FIG. 4, data protection circuitry can include decoder circuitry (e.g., decoders 414-1 (DECODER A) and 414-2 (DECODER B)) and a number of multiplexors (e.g., 412-1, 412-2, . . . , 412-18) (collectively referred to as multiplexors 412). The data protection circuitry shown in FIG. 4 can be configured to route DQs differently depending on the operating mode of the memory devices in order to implement a chip kill data protection scheme. For example, the data protection circuitry shown in FIG. 4 can be used to implement an "8+2" chip kill scheme such as that described in FIGS. 3A-3C.

As described in FIGS. 3A-3C, each of the channels 402-1 (CH1), 402-2 (CH2), . . . , 402-10 (CH10) is a 16-bit wide channel. As shown in FIG. 4, the 8-bit symbols 406-1-1, 406-1-2, 406-2-1, 406-2-2, 406-3-1, 406-3-2, 406-4-1, 406-4-2, 406-5-1, 406-5-2, 406-6-1, 406-6-2, 406-7-1, 406-7-2, 406-8-1, 406-8-2, 406-9-1, 406-9-2, 406-10-1, and 406-10-2 can be routed from the DQs of channels 402-1 to 402-10 differently depending on the operating modes of the memory devices (not shown) corresponding to the channels 402. Routing the DQs differently changes the configuration of the codewords (e.g., 308-1 and 308-2 shown in FIG. 3). For instance, in this example, if the memory devices corresponding to channels 402-1 to 402-10 are x16 mode memory devices, such as described in FIG. 3A, then the symbols 406-1-2, 406-2-2, 406-3-2, 406-4-2, 406-5-2, 406-6-2, 406-7-2, 406-8-2, and 406-9-2 are routed to respective multiplexors 412-10, 412-11, 412-12, 412-13, 412-14, 412-15, 412-16, and 412-17 coupled to decoder 414-2. Also, if the memory devices corresponding to channels 402-1 to 402-10 are x16 mode memory devices, such as described in FIG. 3A, then the symbols 406-2-1, 406-3-1, 406-4-1, 406-5-1, 406-6-1, 406-7-1, 406-8-1, 406-9-1, and 406-10-1 are routed to respective multiplexors 412-1, 412-2, 412-3, 412-4, 412-5, 412-6, 412-7, 412-8, and 412-9 coupled to decoder 414-1.

On the other hand, if the memory devices corresponding to channels 402-1 to 402-10 are x8 mode memory devices, such as described in FIG. 3B, then the symbols 406-1-2, 406-2-1, 406-2-2, 406-3-1, 406-3-2, 406-4-1, 406-4-2, 406-5-1, and 406-5-2 are routed to respective multiplexors 412-1, 412-2, 412-3, 412-4, 412-5, 412-6, 412-7, 412-8, and 412-9 coupled to decoder 414-1, and the symbols 406-6-1, 406-6-2, 406-7-1, 406-7-2, 406-8-1, 406-8-2, 406-9-1, 406-9-2, and 406-10-1 are routed to respective multiplexors 412-10, 412-11, 412-12, 412-13, 412-14, 412-15, 412-16, and 412-17 coupled to decoder 414-2.

In this manner, the multiplexors 412 can be operated to select a different symbol depending on the operating mode of the memory devices. Although only decoders 414-1 and 414-2 are shown in FIG. 4, similar routing applies for encoding the codewords (e.g., routing the symbols 306 from encoder outputs to the DQs of the memory devices).

Figure 5A:
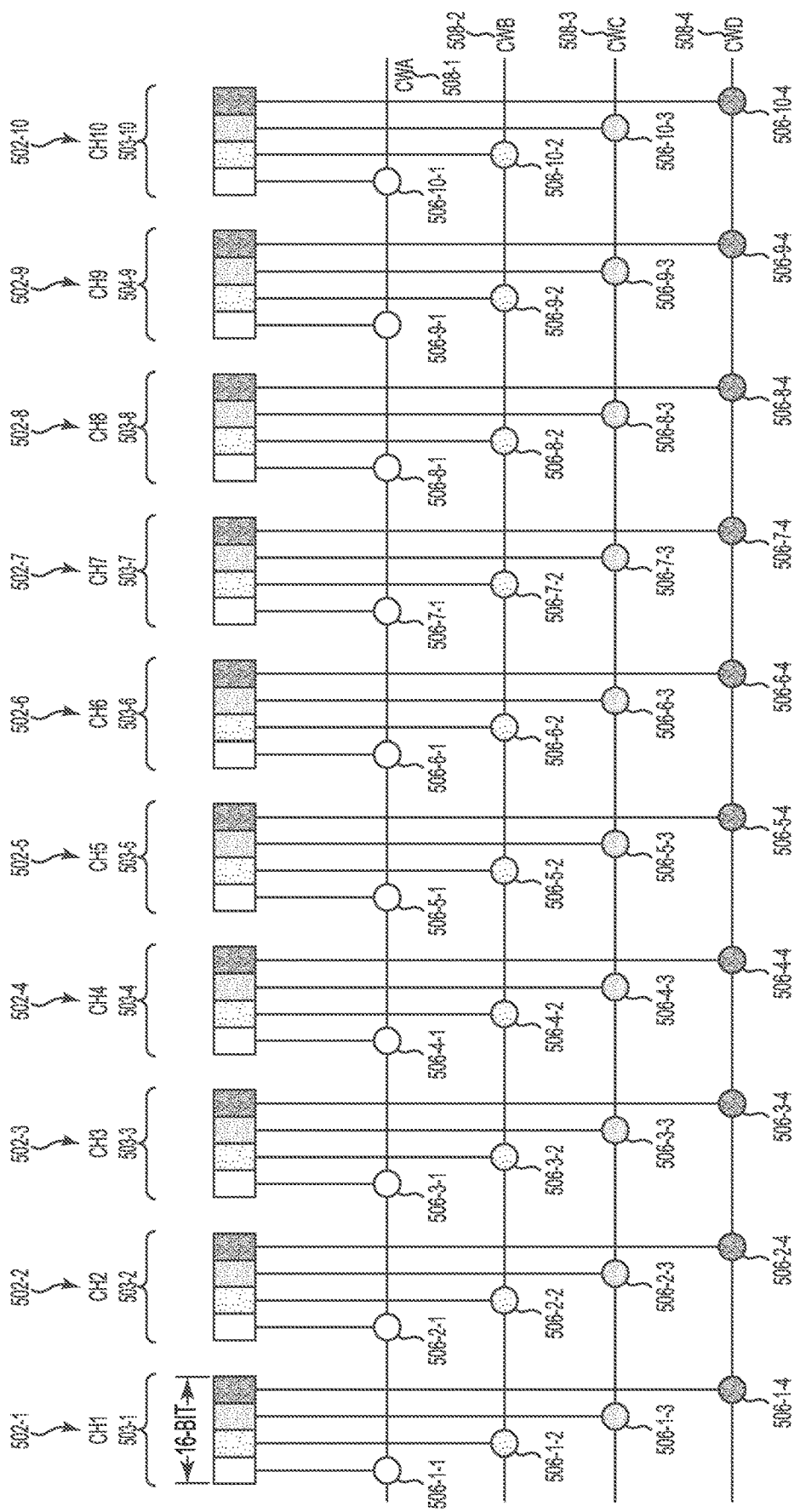
FIG. 5A illustrates example codeword compositions corresponding to a data protection scheme that spans multiple channels comprising memory devices having a particular operating mode.

FIG. 5A illustrates example codeword compositions corresponding to a data protection scheme that spans multiple channels comprising memory devices having a particular operating mode. The example shown in FIG. 5A illustrates four codewords 508-1 (CWA), 508-2 (CWB), 508-3 (CWC), and 508-4 (CWD) generated by a plurality of memory devices 503-1 to 503-10 (referred to collectively as memory devices 503) corresponding to respective channels 502-1 (CH1) to 502-10 (CH10) (referred to collectively as channels 502). In this example, the channels 502 have a width of 16 bits and the memory devices 503 are x16 mode memory devices such that the memory devices 503 each provide 16 bits across the respective channels 502 per beat. As noted above, the memory devices 503 can be, for example, a package comprising multiple components (e.g., dice) grouped as a number of ranks. In this example, the data protection scheme is a "chip kill" scheme in which each codeword (e.g., 508-1, 508-2, 508-3, and 508-4) comprises eight data symbols and two parity symbols (which may be referred to as an "8+2" scheme). The data protection scheme allows for the data of codewords 508-1, 508-2, 508-3, and 508-4 to be recovered if one of the channels 502 fails. For example, if the memory device 503-1 is determined to be defective, the data of codewords 508-1 to 508-4 can be recovered using the data symbols from the other (e.g., non-defective) channels 502 and the parity symbols.

As shown in FIG. 5A, codeword 508-1 comprises symbols 506-1-1, 506-2-1, 506-3-1, 506-4-1, 506-5-1, 506-6-1, 506-7-1, 506-8-1, 506-9-1, and 506-10-1, and codeword 508-2 comprises symbols 506-1-2, 506-2-2, 506-3-2, 506-4-2, 506-5-2, 506-6-2, 506-7-2, 506-8-2, 506-9-2, and 506-10-2. Further, codeword 508-3 comprises symbols 506-1-3, 506-2-3, 506-3-3, 506-4-3, 506-5-3, 506-6-3, 506-7-3, 506-8-3, 506-9-3, and 506-10-3, and codeword 508-4 comprises symbols 506-1-4, 506-2-4, 506-3-4, 506-4-4, 506-5-4, 506-6-4, 506-7-4, 506-8-4, 506-9-4, and 506-10-4. The symbols can be collectively referred to as symbols 506. In this example each of the symbols 506 comprise 4 bits such that each x16 mode device 503 provides 4 bits to each of codeword 508-1 to 508-4 per beat; however, embodiments are not so limited. Also, in this example, the symbols 506-9-1 and 506-10-1 are the parity symbols for codeword 508-1, the symbols 506-9-2 and 506-10-2 are the parity symbols for codeword 508-2, the symbols 506-9-3 and 506-10-3 are the parity symbols for codeword 508-3, and the symbols 506-9-4 and 506-10-4 are the parity symbols for codeword 508-4. However, embodiments are not limited to parity symbols being provided from particular channels.

Figure 5B:
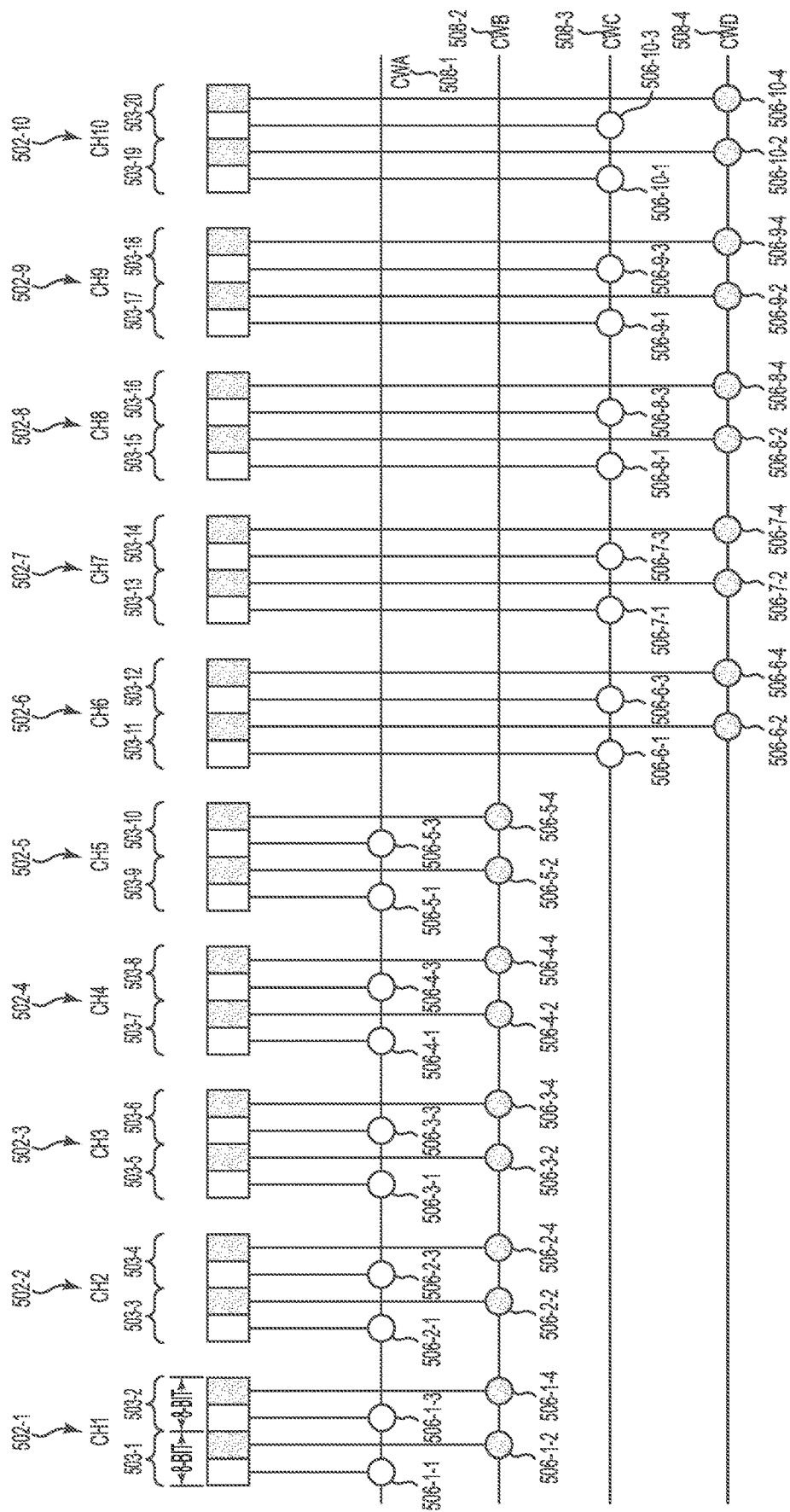
FIG. 5B illustrates example codeword compositions corresponding to a data protection scheme that spans multiple channels comprising memory devices having a particular operating mode.

In various embodiments, the codewords 508-1 to 508-4 are decoded by decoder circuitry and encoded by encoder circuitry, which may be included within data protection circuitry such as data protection circuitry 113 and 213 described in association with FIGS. 1 and 2, respectively. Each of the codewords 508-1 to 508-4 can be provided to the same encoder/decoder FIG. 5B illustrates example codeword compositions corresponding to a data protection scheme that spans multiple channels comprising memory devices having a particular operating mode. Similar to the example shown in FIG. 5A, the example shown in FIG. 5B illustrates four codewords 508-1 (CWA), 508-2 (CWB), 508-3 (CWC), and 508-4 (CWD) generated by memory devices 503 across multiple channels 502-1 (CH1) to 502-10 (CH10), with each channel 502 having a width of 16 bits. However, in the example shown in FIG. 5B, the memory devices 503-1 to 503-20 are x8 mode memory devices such that two memory devices 503 per channel 502 contribute 8 bits each to generate codewords 508-1 to 508-4. In this example, the data protection scheme is an "8+2" chip kill scheme in which each codeword (e.g., 508-1 to 508-4) comprises eight data symbols and two parity symbols.

As shown in FIG. 5B, codeword 508-1 comprises symbols 506-1-1, 506-1-3, 506-2-1, 506-2-3, 506-3-1, 506-3-3, 506-4-1, 506-4-3, 506-5-1, and 506-5-3, and codeword 508-2 comprises symbols 506-1-2, 506-1-4, 506-2-2, 506-2-4, 506-3-2, 506-3-4, 506-4-2, 506-4-4, 506-5-2, and 506-5-4. Further, codeword 508-3 comprises symbols 506-6-1, 506-6-3, 506-7-1, 506-7-3, 506-8-1, 506-8-3, 506-9-1, 506-9-3, 506-10-1, and 506-10-3, and codeword 508-4 comprises symbols 506-6-2, 506-6-4, 506-7-2, 506-7-4, 506-8-2, 506-8-4, 506-9-2, 506-9-4, 506-10-2, and 506-10-4. Similar to the example in FIG. 5A, each of the symbols 506 comprise 4 bits; however, in this example, the codewords 508-1 to 508-4 are configured differently. For instance, in the example shown in FIG. 5B, the symbols 506-5-1 and 506-5-3 from channel 502-5 are the parity symbols corresponding to codeword 508-1 and the symbols 506-5-2 and 506-5-4 are the parity symbols for codeword 508-2. Further, the symbols 506-10-1 and 506-10-3 are the parity symbols for codeword 508-3 and the symbols 506-10-2 and 506-10-4 are the parity symbols for codeword 508-4. Also, in this example, each x8 mode device 503 provides two different codewords of 4 bits each per beat, whereas in the example shown in FIG. 5A, each x16 mode device provides 4 bits to each of four different codewords 508-1 to 508-4 per beat.

In various embodiments, the codewords 508-1 to 508-4 are decoded by decoder circuitry and encoded by encoder circuitry, which may be included within data protection circuitry such as data protection circuitry 113 and 213 described in association with FIGS. 1 and 2, respectively. Each of the codewords 508-1 to 508-4 can be provided to the same encoder/decoder.

Figure 5C:
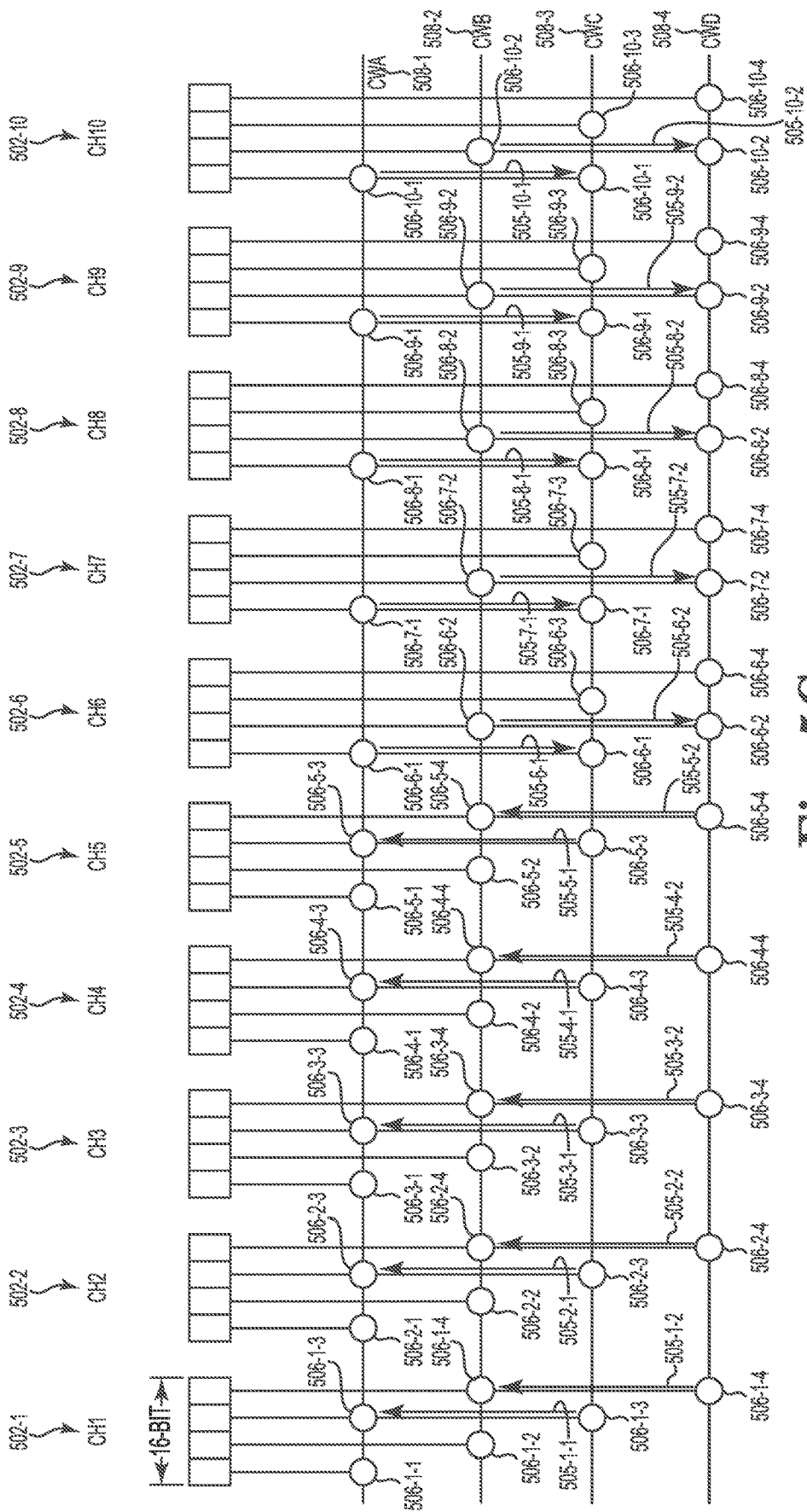
FIG. 5C illustrates an example of how the composition of codewords corresponding to a data protection scheme can be configurable based on the operating mode of memory devices in accordance with a number of embodiments of the present disclosure.

FIG. 5C illustrates an example of how the composition of codewords corresponding to a data protection scheme can be configurable based on the operating mode of memory devices in accordance with a number of embodiments of the present disclosure. FIG. 5C illustrates an example of how codewords 508-1 to 508-4 can be configured differently in order to implement a data protection scheme (e.g., chip kill scheme) using the same data protection circuitry (e.g., encoder/decoder hardware) for memory devices having different operating modes. FIG. 5C represents a combination of the chip kill schemes described in FIGS. 5A and 5B.

In the example shown in FIG. 5C, the configuration of the codewords 508-1 to 508-4 is based on the operating mode of the memory devices 503. The different codeword configurations are defined by arrows 505-1-1, 505-1-2, 505-2-1, 505-2-2, 505-3-1, 505-3-2, 505-4-1, 505-4-2, 505-5-1, 505-5-2, 505-6-1, 505-6-2, 505-7-1, 505-7-2, 505-8-1, 505-8-2, 505-9-1, 505-9-2, 505-10-1, and 505-10-2 (referred to collectively as arrows 505). That is, a first codeword configuration, such as that shown in FIG. 5A is represented by the tails (e.g., backs) of the arrows 505, and a second codeword configuration, such as that shown in FIG. 5B, is represented by the heads (e.g., fronts) of the arrows 505. For example, if the memory devices are x16 mode devices such as shown in FIG. 5A, then the data protection circuitry can be configured to encode/decode codewords 508-1 to 508-4 as shown in FIG. 5A, and if the memory devices are x8 mode devices such as shown in FIG. 5B, then the data protection circuitry can be configured to encode/decode codewords 508-1 to 508-4 as shown in FIG. 5B. For example, as described in FIG. 6, the same encoder/decoder circuitry can be used to accommodate different codeword configurations by routing the DQs of the memory devices differently depending on the operating modes of the memory devices.

Figure 6:
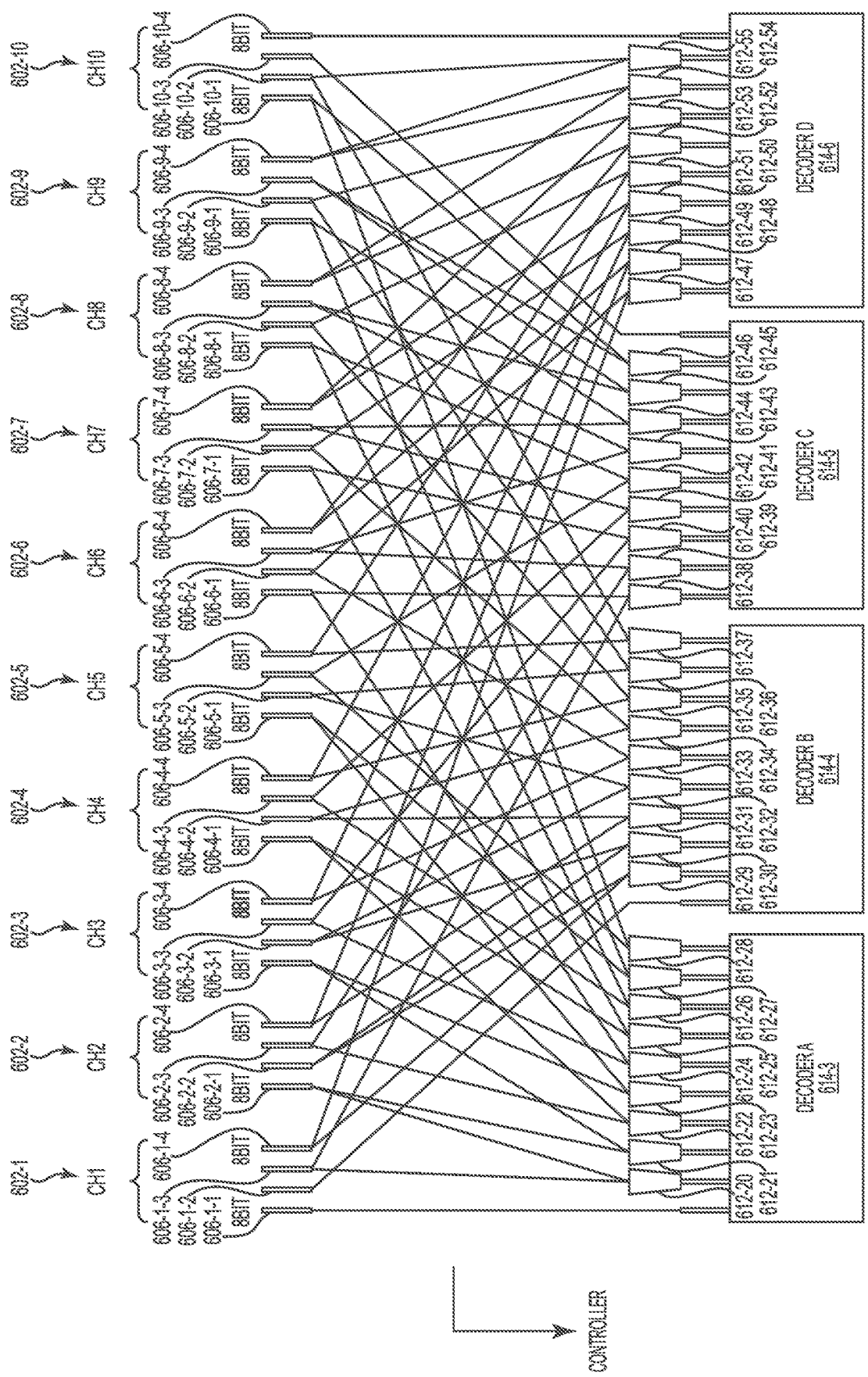
FIG. 6 illustrates a functional block diagram of example configurable data protection circuitry in accordance with a number of embodiments of the present disclosure.

FIG. 6 illustrates a functional block diagram of example configurable data protection circuitry in accordance with a number of embodiments of the present disclosure. In a number of embodiments, and as shown in FIG. 6, data protection circuitry can include decoder circuitry (e.g., decoders 614-3 (DECODER A), 614-4 (DECODER B), 614-5 (DECODER C), and 614-6 (DECODER D)) and a number of multiplexors (e.g., 612-20, 612-21, . . . , 612-55) (collectively referred to as multiplexors 612). The data protection circuitry shown in FIG. 6 can be configured to route DQs differently depending on the operating mode of the memory devices in order to implement a chip kill data protection scheme. For example, the data protection circuitry shown in FIG. 6 can be used to implement an "8+2" chip kill scheme such as that described in FIGS. 5A-5C.

As described in FIGS. 5A-5C, each of the channels 602-1 (CH1), 602-2 (CH2), . . . , 602-10 (CH10) is a 16-bit wide channel. As shown in FIG. 6, the 4-bit symbols 606-1-1, 606-1-2, 606-1-3, 606-1-4, 606-2-1, 606-2-2, 606-2-3, 606-2-4, 606-3-1, 606-3-2, 606-3-3, 606-3-4, 606-4-1, 606-4-2, 606-4-3, 606-4-4, 606-5-1, 60651-2, 606-5-3, 606-5-4, 606-6-1, 606-6-2, 606-6-3, 606-6-4, 606-7-1, 606-7-2, 606-7-3, 606-7-4, 606-8-1, 606-8-2, 606-8-3, 606-8-4, 606-9-1, 606-9-2, 606-9-3, 606-9-4, 606-10-1, 606-10-2, 606-10-3, and 606-10-4 can be routed from the DQs of channels 602-1 to 602-10 differently depending on the operating modes of the memory devices (not shown) corresponding to the channels 602. Routing the DQs differently changes the configuration of the codewords (e.g., 508-1, 508-2, 508-3, and 508-4 shown in FIG. 5). For instance, in this example, if the memory devices corresponding to channels 602-1 to 602-10 are x16 mode memory devices, such as described in FIG. 5A, then the symbols 606-1-3, 606-2-3, 606-3-3, 606-4-3, 606-5-3, 606-6-3, 606-7-3, 606-8-3, and 606-9-3 are routed to respective multiplexors 612-38, 612-39, 612-40, 612-41, 612-42, 612-43, 612-44, 612-45, and 612-46, and coupled to decoder 614-5. Further, the symbols 606-2-1, 606-3-1, 606-4-1, 606-5-1, 606-6-1, 606-7-1, 606-8-1, 606-9-1, and 606-10-1 are routed to respective multiplexors 612-20, 612-21, 612-22, 612-23, 612-24, 612-25, 612-26, 612-27, and 612-28 and coupled to decoder 614-3. Further, the symbols 606-2-2, 606-3-2, 606-4-2, 606-5-2, 606-6-2, 606-7-2, 606-8-2, 606-9-2, and 606-10-2 are routed to respective multiplexors 612-29, 612-30, 612-31, 612-32, 612-33, 612-34, 612-35, 612-36, and 612-37 and coupled to decoder 614-4. Further, the symbols 606-1-4, 606-2-4, 606-3-4, 606-4-4, 606-5-4, 606-6-4, 606-7-4, 606-8-4, and 606-9-4 are routed to respective multiplexors 612-47, 612-48, 612-49, 612-50, 612-51, 612-52, 612-53, 612-54, and 612-55 and coupled to decoder 614-6.

On the other hand, if the memory devices corresponding to channels 602-1 to 602-10 are x8 mode memory devices, such as described in FIG. 5B, then the symbols 606-1-3, 606-2-1, 606-2-3, 606-3-1, 606-3-3, 606-4-1, 606-4-3, 606-5-1, and 606-5-3 are routed to respective multiplexors 612-20, 612-21, 612-22, 612-23, 612-24, 612-25, 612-26, 612-27, and 612-28 and coupled to decoder 614-3. Further, the symbols 606-1-4, 606-2-2, 606-2-4, 606-3-2, 606-3-4, 606-4-2, 606-4-4, 606-5-2, and 606-5-4 are routed to respective multiplexors 612-29, 612-30, 612-31, 612-32, 612-33, 612-34, 612-35, 612-36, and 612-37 and coupled to decoder 614-4. Further, the symbols 606-6-1, 606-6-3, 606-7-1, 606-7-3, 606-8-1, 606-8-3, 606-9-1, 606-9-3, and 606-10-1 are routed to respective multiplexors 612-38, 612-39, 612-40, 612-41, 612-42, 612-43, 612-44, 612-45, and 612-46, and coupled to decoder 614-5. Further, the symbols 606-6-2, 606-6-4, 606-7-2, 606-7-4, 606-8-2, 606-8-4, 606-9-2, 606-9-4, and 606-10-2 are coupled to respective multiplexors 612-47, 612-48, 612-49, 612-50, 612-51, 612-52, 612-53, 612-54, and 612-55 and coupled to decoder 614-6.

In this manner, the multiplexors 612 can be operated to select a different symbol depending on the operating mode of the memory devices. Although only decoders 614-3, 614-4, 614-5, and 614-6 are shown in FIG. 6, similar routing applies for encoding the codewords (e.g., routing the symbols 506 from encoder outputs to the DQs of the memory devices).

The figures herein follow a numbering convention in which the first digit or digits correspond to the figure number and the remaining digits identify an element or component in the figure. Similar elements or components between different figures may be identified by the use of similar digits. For example, 113 may reference element "13" in FIG. 1, and a similar element may be referenced as 213 in FIG.

2. A group or plurality of similar elements or components may generally be referred to herein with a single element number. For example, a plurality of reference elements 203-1 to 203-N may be referred to generally as 203. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
 a memory comprising a plurality of memory devices; and
 a memory controller coupled to the memory via a plurality of channels comprising respective subsets of the plurality of memory devices, the memory controller comprising:
  data protection circuitry configured to:
   accommodate a first codeword configuration of a number of codewords responsive to the plurality of memory devices having a first operating mode corresponding to a first input/output (I/O) width;
   accommodate a second codeword configuration of the number of codewords responsive to the plurality of memory devices having a second operating mode corresponding to a second I/O width, different from the first I/O width; and
   switch between the first operating mode of the plurality of memory devices and the second operating mode of the plurality of memory devices.

2. The apparatus of claim 1, wherein each of the plurality of channels has a width of N bits, wherein N is an integer that is greater than one.

3. The apparatus of claim 1, wherein data transferred from the plurality of memory devices forms codewords, each codeword including data from a first memory device of the plurality of memory devices and data from a second memory device of the plurality of memory devices, wherein the first memory device and the second memory device are coupled to different channels.

4. The apparatus of claim 3, wherein each of the codewords includes data transferred from one of two memory devices coupled to each channel.

5. The apparatus of claim 1, wherein encoder circuitry and decoder circuitry configured to map I/O pins to codewords when the data protection circuitry is in a first operating mode is the same encoder circuitry and decoder circuitry configured to map I/O pins to codewords when the data protection circuitry is in a second operating mode.

6. The apparatus of claim 1, wherein the first operating mode is one of an x8 operating mode and an x16 operating mode and the second operating mode is the other of the x8 operating mode and the x16 operating mode.

7. The apparatus of claim 1, wherein the data protection circuitry is chip kill circuitry.

8. The apparatus of claim 1, wherein each of the plurality of channels are low-power double data rate 5 (LPDDR5) channels.

9. A method, comprising:
 receiving, by a controller, data corresponding to a number of codewords from a plurality of memory channels, each one of the plurality of memory channels having a respective channel width,
 wherein each memory channel is coupled to a number of memory devices, and wherein each memory device of the number of memory devices:
  is configured to store data corresponding to one or more of the number of codewords; and
  has a particular operating mode corresponding to its input/output (I/O) width; and
 operating data protection circuitry of the controller to:
  accommodate a first codeword configuration of the number of codewords responsive to the number of memory devices having a first operating mode corresponding to a first I/O width; and
  accommodate a second codeword configuration of the number of codewords responsive to the number of memory devices having a second operating mode corresponding to a second I/O width, different from the first I/O width.

10. The method of claim 9, wherein each memory channel has a same channel width.

11. The method of claim 9, further comprising accessing data from a first memory device of the number of memory devices and data from a second memory device of the number of memory devices separately when chip kill circuitry is configured in the second mode.

12. An apparatus, comprising:
 a memory controller comprising chip kill circuitry configured to map input/output (110) pins to receive codewords from a plurality of memory devices;
 a plurality of channels coupled to the memory controller configured to transfer the codewords from the plurality of memory devices to the memory controller, wherein each codeword includes a plurality of symbols; and
 a plurality of multiplexors configured to switch between a plurality of signaling paths to facilitate different modes of the chip kill circuitry.

13. The apparatus of claim 12, wherein the plurality of multiplexors includes a first group of the plurality of multiplexors coupled to a first decoder and a second group of the plurality of multiplexors coupled to a second decoder.

14. The apparatus of claim 13, wherein the first group of the plurality of multiplexors is coupled to a first plurality of channels and the second group of the plurality of multiplexors is coupled to a second plurality of channels when the chip kill circuitry is in a second operating mode.

15. The apparatus of claim 12, wherein each symbol of the plurality of symbols is routed to a different multiplexor based on whether the chip kill circuitry is in a first mode or a second mode.

16. The apparatus of claim 12, wherein a number of memory devices in a rank is determined by a mode of the plurality of memory devices in the rank.

17. The apparatus of claim 16, wherein each rank includes one memory device per channel when the plurality of memory devices are in a first mode.

18. The apparatus of claim 16, wherein each rank includes two memory devices per channel when the plurality of memory devices are in the second operating mode.

19. The apparatus of claim 12, wherein an even codeword comprises even data symbols and an odd codeword comprises odd data symbols.

20. The apparatus of claim 12, wherein a mode of the chip kill circuitry determines which channels provide data symbols and which channels provide parity symbols.

* * * * *